United States Patent
Wan et al.

(10) Patent No.: US 11,817,407 B2
(45) Date of Patent: *Nov. 14, 2023

(54) MOLDED SEMICONDUCTOR PACKAGE WITH HIGH VOLTAGE ISOLATION

(71) Applicant: Infineon Technologies AG, Neubiberg (DE)

(72) Inventors: Shao Ping Wan, Singapore (SG); Eric Brion Acquitan, Singapore (SG); Dexter Reynoso, Singapore (SG); Jürgen Schredl, Mering (DE); Woon Yik Yong, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/746,306

(22) Filed: May 17, 2022

(65) Prior Publication Data

US 2022/0278060 A1 Sep. 1, 2022

Related U.S. Application Data (63) Continuation of application No. 17/113,170, filed on Dec. 7, 2020, now Pat. No. 11,355,460.

(51) Int. Cl.
*H01L 23/00* (2006.01)
*H01L 23/31* (2006.01)
*H01L 21/56* (2006.01)

(52) U.S. Cl.
CPC ............ *H01L 24/05* (2013.01); *H01L 21/565* (2013.01); *H01L 23/3142* (2013.01);
(Continued)

(58) Field of Classification Search
CPC ... H01L 24/05; H01L 21/565; H01L 23/3142; H01L 24/45; H01L 24/85; H01L 2224/0569; H01L 2924/301
See application file for complete search history.

(56) References Cited

U.S. PATENT DOCUMENTS 5,430,329 A    7/1995  Harada et al.
8,664,090 B1   3/2014  Nangalia et al.
(Continued)

FOREIGN PATENT DOCUMENTS

DE       19717368 A1 *  4/1998  ............. H01L 24/03
DE   102014100931 A1 *  8/2014  ............. H01L 21/56
(Continued)

OTHER PUBLICATIONS

"Low temperature glue materials. Non-conductive, polyimide based glues.", FUJIFILM Electronic Material, FFEM—LTG product update, Feb. 16, 2017, 1-7.

*Primary Examiner* — Mamadou L Diallo
(74) *Attorney, Agent, or Firm* — Murphy, Bilak & Homiller, PLLC (57) ABSTRACT

A molded semiconductor package includes: a semiconductor die attached to a substrate, the semiconductor die having a bond pad at a first side of the semiconductor die which faces away from the substrate and an insulating layer covering the first side; an electrical conductor attached to a part of the bond pad exposed by an opening in the insulating layer; a mold compound encasing the semiconductor die; and an electrically insulative material filling the opening in the insulating layer and sealing the part of the bond pad exposed by the opening in the insulating layer. The electrically insulative material separates the mold compound from the part of the bond pad exposed by the opening in the insulating layer. A corresponding method of producing the molded semiconductor package also is described.

21 Claims, 8 Drawing Sheets

(52) U.S. Cl.
CPC .............. *H01L 24/45* (2013.01); *H01L 24/85* (2013.01); *H01L 2224/0569* (2013.01); *H01L 2924/301* (2013.01)

(56) References Cited

U.S. PATENT DOCUMENTS

| | | | |
|---|---|---|---|
| 9,245,862 | B1 | 1/2016 | Nangalia et al. |
| 11,355,460 | B1 * | 6/2022 | Wan ................... H01L 23/3107 |
| 2001/0004124 | A1 | 6/2001 | Noda et al. |
| 2002/0043723 | A1 | 4/2002 | Shimizu et al. |
| 2002/0139976 | A1 | 10/2002 | Hembree et al. |
| 2002/0179974 | A1 | 12/2002 | Noda et al. |
| 2003/0178655 | A1 | 9/2003 | Winslow |
| 2004/0067604 | A1 | 4/2004 | Ouellet et al. |
| 2004/0070042 | A1 | 4/2004 | Lee et al. |
| 2005/0017361 | A1 | 1/2005 | Lin et al. |
| 2009/0079042 | A1 * | 3/2009 | Clatterbaugh .......... H01L 24/45 257/664 |
| 2010/0127383 | A1 | 5/2010 | Oka et al. |
| 2014/0218885 | A1 * | 8/2014 | Hosseini ................. H01L 23/50 361/767 |
| 2014/0246790 | A1 | 9/2014 | Haney et al. |
| 2014/0264952 | A1 | 9/2014 | Denning |
| 2016/0035672 | A1 | 2/2016 | Funaya et al. |
| 2017/0141567 | A1 | 5/2017 | Basler et al. |
| 2019/0206812 | A1 | 7/2019 | Bonifield et al. |
| 2020/0075496 | A1 | 3/2020 | Yu et al. |
| 2021/0127490 | A1 | 4/2021 | Palm et al. |
| 2021/0398883 | A1 | 12/2021 | Chen et al. |
| 2022/0004070 | A1 | 1/2022 | Okazaki et al. |
| 2022/0278060 | A1 * | 9/2022 | Wan ........................ H01L 23/66 |

FOREIGN PATENT DOCUMENTS

| | | | | |
|---|---|---|---|---|
| DE | 102018128414 A1 | * | 5/2019 | ....... H01L 23/49517 |
| EP | 2677541 A1 | * | 12/2013 | ............. H01L 24/48 |
| JP | 2006261173 A | * | 9/2006 | ............. H01L 24/05 |
| JP | 2013235948 A | * | 11/2013 | |
| TW | 200811970 A | * | 3/2008 | ............. H01L 24/48 |
| WO | WO-2014048449 A1 | * | 4/2014 | ............. H01L 24/48 |

* cited by examiner

MOLDED SEMICONDUCTOR PACKAGE WITH HIGH VOLTAGE ISOLATION

BACKGROUND

Molded semiconductor packages have one or more semiconductor dies (chips) with bond pads that are exposed by openings in an insulating material such as oxide. Wire bonds or other types of electrical connectors are attached to the bond pads for providing external electrical connections to each die included in the package. Imide is typically provided over the insulating material to provide high voltage isolation at least for certain bond pads such as pads that require galvanic isolation. A mold compound encases each semiconductor die included in the package and fills the openings in the insulation stack which expose the bond pads.

The interface between the mold compound and the imide is a critical interface in that a high electric field arises in this area, but the mold compound has low breakthrough voltage property. That is, the mold compound is a weaker dielectric material compared to the imide and therefore limits the amount of high voltage isolation at the bond pads. However, the mold compound defines the final profile of the package and therefore must meet creepage and clearance requirements for the package. To reduce the electric field at the interface between the mold compound and the imide means that the imide thickness must be increased, e.g., from about 5 μm (microns) to about 15 μm or more. However, each bond pad area is still exposed to the mold compound which has lower breakthrough voltage compared to imide and oxide.

Thus, there is a need for a molded semiconductor package technology with improved high voltage isolation.

SUMMARY

According to an embodiment of a molded semiconductor package, the molded semiconductor package comprises: a first semiconductor die attached to a first substrate, the first semiconductor die comprising a first bond pad at a first side of the first semiconductor die which faces away from the first substrate and an insulating layer covering the first side; an electrical conductor attached to a part of the first bond pad exposed by an opening in the insulating layer; a mold compound encasing the first semiconductor die; and an electrically insulative material filling the opening in the insulating layer and sealing the part of the first bond pad exposed by the opening in the insulating layer, wherein the electrically insulative material separates the mold compound from the part of the first bond pad exposed by the opening in the insulating layer. A breakdown voltage of the electrically insulative material may be greater than a breakdown voltage of the mold compound.

According to an embodiment of a method of producing a molded semiconductor package, the method comprises: attaching a first semiconductor die to a first substrate, the first semiconductor die comprising a first bond pad at a first side of the first semiconductor die which faces away from the first substrate and an insulating layer covering the first side; forming an opening in the insulating layer which exposes the first bond pad; attaching an electrical conductor attached to a part of the first bond pad exposed by the opening in the insulating layer; after attaching the electrical conductor, filling the opening in the insulating layer with an electrically insulative material that seals the part of the first bond pad exposed by the opening in the insulating layer; and after filling the opening in the insulating layer with the electrically insulative material, encasing the first semiconductor die in a mold compound, wherein the mold compound is separated from the part of the first bond pad exposed by the opening in the insulating layer by the electrically insulative material. A breakdown voltage of the electrically insulative material may be greater than a breakdown voltage of the mold compound.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a molded semiconductor package with increased high voltage isolation at one or more die (chip) bond pads. The part of a die pad which would typically be exposed to mold compound by an opening in the top (passivation) insulating layer of the die is instead sealed by an additional electrically insulative material. The electrically insulative material fills the opening in the insulating layer prior to molding, thus separating the mold compound from the part of the bond pad exposed by the opening in the insulating layer. The breakdown voltage of the electrically insulative material is greater than the breakdown voltage of the mold compound, thereby providing a more robust breakthrough voltage barrier in the region of the bond pad.

Described next, with reference to the figures, are exemplary embodiments of the molded semiconductor package technology with increased high voltage isolation.

FIGS. 1A through 1E illustrate respective partial cross-sectional views of a molded semiconductor package during different stages of production. The molded semiconductor package includes at least a first semiconductor die 100 attached to a substrate 102. The semiconductor die 100 may be attached to the substrate 102 after formation of a bond pad opening and after singulation of the base semiconductor wafer into individual dies. Only part of the first semiconductor die 100 and substrate 102 are shown. The substrate 102 may be a circuit board such as a single or multi-layer PCB (printed circuit board), a die pad of a lead frame, a DBC (direct bonded copper) substrate, an AMB (active metal brazed) substrate, an IMS (insulated metal substrate), etc.

The first semiconductor die 100 may be a logic die such as a processor die, memory die, etc., a power semiconductor die such as a power transistor die, a power diode die, a half bridge die, etc., or a die that combines logic and power devices on the same semiconductor substrate 104. One or more interlayer dielectrics 106 and metallization layers 108 are formed above the semiconductor substrate 104. Each metallization layer 108 provides one or more electrical pathways or connections for devices formed in the semiconductor substrate 104. Each interlayer dielectric 106 electrically separates closely spaced interconnect lines arranged in different metallization layers 108.

Bond pads 110 are formed as part of or on the last (uppermost) metallization layer 108 of the first semiconductor die 100. Each bond pad 110 is configured for attachment of an electrical conductor such as one or more wire bonds, one or more wire ribbons, a metal clip, etc. A single bond pad 110 is shown in FIGS. 1A through 1E for ease of illustration and understanding. This bond pad 110 is subjected to high electric fields during use of the molded semiconductor package, e.g., electric fields greater than 100 V/μm, electric fields greater than 150 V/μm, electric fields greater than 200 V/μm or even higher.

An insulation structure 112 such as SiOx covers the last metallization layer 108. The bond pads 110 remain uncovered by the insulation structure 112.

The first semiconductor die 100 also includes an insulating layer 114 covering the side of the die 100 that will face away from the substrate 102 after the die 100 is attached to the substrate 102. The insulating layer 114 may be a passivation layer in that the insulating layer 114 may be less affected or corroded by the environment of future use. In one embodiment, the insulating layer 114 comprises imide.

Figure 1A:
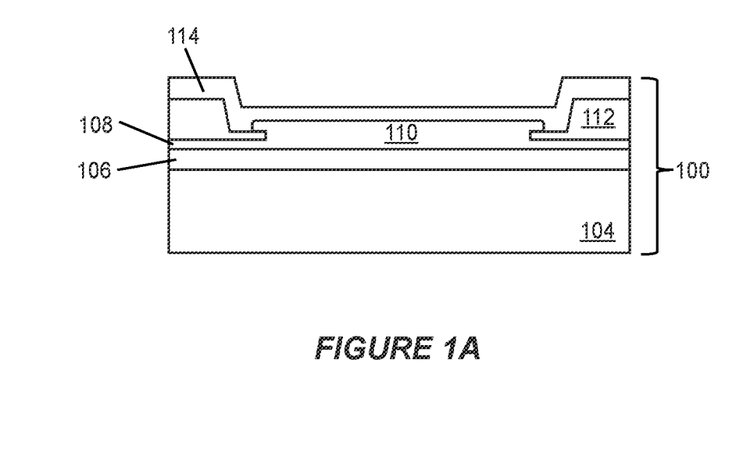
FIGS. 1A through 1E illustrate respective partial cross-sectional views of a molded semiconductor package during different stages of production.

FIG. 1A shows the first semiconductor die 100 before an opening is formed in the insulating layer 114 to expose the bond pad 110. In one embodiment, at least the last metallization layer 108 and bond pad 110 are formed from Cu. However, other metal or metal alloys may be used for the last metallization layer 108 and bond pad 110 such as Al, Au, AlSiCu, etc.

Figure 1B:
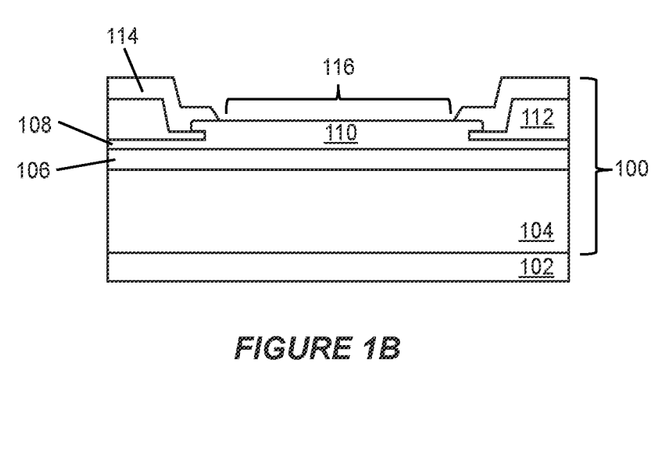

FIG. 1B shows the first semiconductor die 100 after an (bond pad) opening 116 is formed in the insulating layer 114 to expose the bond pad 110, and after the semiconductor die 100 is attached to the substrate 102. As explained above, the semiconductor die 100 may be attached to the substrate 102 after formation of the bond pad opening 116 and after singulation of the base wafer into individual dies. The opening 116 may be formed by masked etching of the insulating layer 114.

Figure 1C:
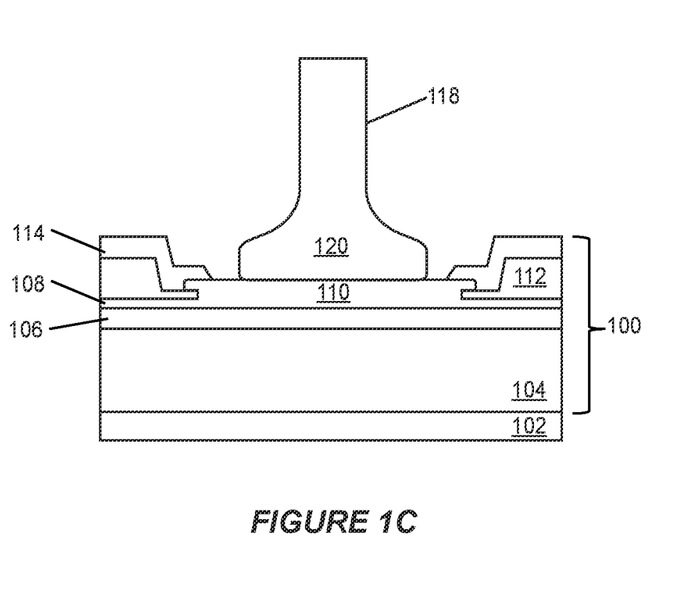

FIG. 1C shows the first semiconductor die 100 after an electrical conductor 118 is attached to the part of the bond pad 110 exposed by the opening 116 in the insulating layer 114. In one embodiment, the electrical conductor 118 is one or more wire bonds and a ball end 120 of each wire bond is attached to the part of the bond pad 110 exposed by the opening 116 in the insulating layer 114. Other types of electrical conductors may be used such as one or more wire ribbons, a metal clip, etc.

Figure 1D:
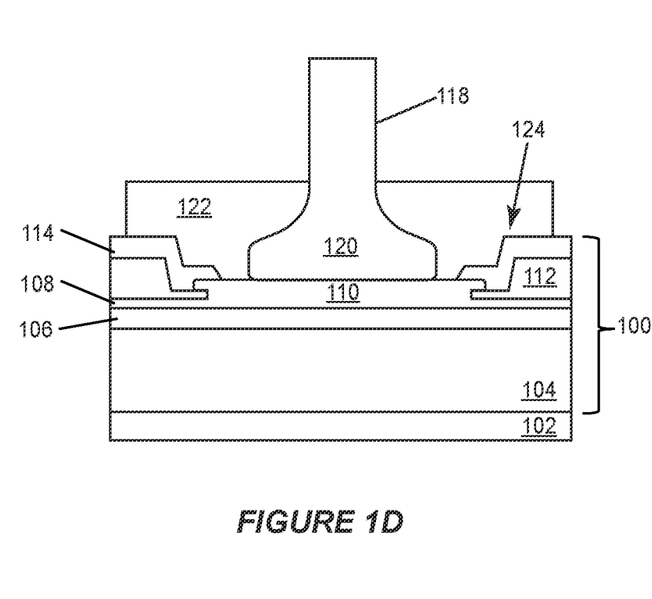

FIG. 1D shows the first semiconductor die 100 after an electrically insulative material 122 fills the opening 116 in the insulating layer 114 and (hermetically) seals the part of the bond pad 110 exposed by the opening 116 in the insulating layer 114. In one embodiment, the electrically insulative material 122 is a non-conductive, polyimide-based glue. For example, the glue material may be based on a polyimide polymer backbone. Alternatively, the electrically insulative material 122 may also be a non-adhesive polyimide-based material provided that the breakdown voltage of the electrically insulative material 122 is greater than a breakdown voltage of the subsequently deposited mold compound 126.

The electrically insulative material 122 encases at least the part of the end of the electrical conductor 118 disposed closest to the bond pad 110. For example, in the case of a wire bond as the electrical conductor 118, the electrically insulative material 122 may cover at least the lower part of the ball end 120 disposed closest to the bond pad 110. As shown in FIG. 1D, the electrically insulative material 122 may cover the entire ball end 120 of the wire bond.

In one embodiment, the electrically insulative material 122 and the insulating layer 114 are cross-linked to one another along an interface 124 between the electrically insulative material 122 and the insulating layer 114. For example, the electrically insulative material 122 may comprise polyimide, the insulating layer 114 may comprise imide and the polyimide may be cross-linked with the imide along the interface 124 between the electrically insulative material 122 and the insulating layer 114. In one embodiment, the imide has a thickness in a range of 3 μm (microns) to 20 μm and the electrically insulative material has a thickness in a range of 5 μm to 25 μm. Other combinations of materials for the insulating layer 114 and electrically insulative material 122 are also possible provided a breakdown voltage of the electrically insulative material 122 is greater than a breakdown voltage of the subsequently deposited mold compound 126. Preferably, the insulating layer 114 and electrically insulative material 122 are capable of cross-linking to form a single layer at the interface through processing methods such as curing.

Figure 1E:
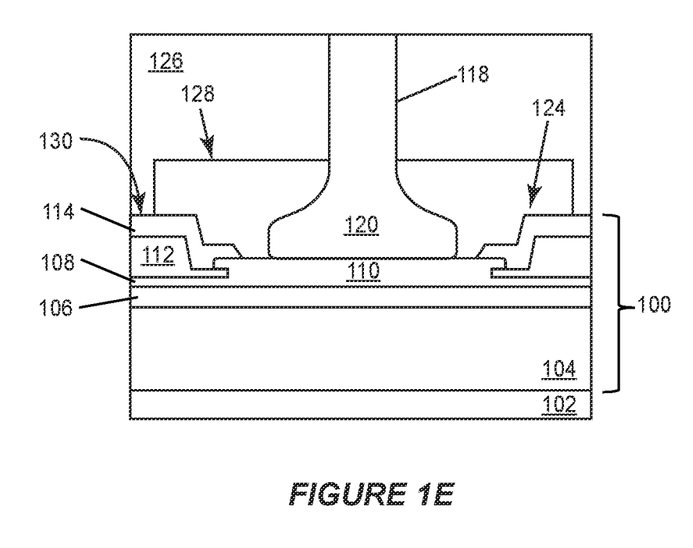

FIG. 1E shows the first semiconductor die 100 after a mold compound 126 encases the die 100. The mold compound 126 may contact the insulating layer 114 at the side of the first semiconductor die 100 facing away from the substrate 102, as shown in FIG. 1E. However, the entire side of the first semiconductor die 100 which faces away from the substrate 102 may be covered by the electrically insulative material 122. In this case, the mold compound 126 does not contact the insulating layer 114 at the side of the first semiconductor die 100 facing away from the substrate 102.

An adhesion layer (not shown) such as zinc chromium may be used to promote adhesion of the mold compound 126. By covering the entire side of the first semiconductor die 100 which faces away from the substrate 102 with the electrically insulative material 122, ions are prevented from seeping from the adhesion layer into the first semiconductor 100 through the openings 116 in the insulating layer 114.

In each case, the electrically insulative material 122 separates the mold compound 126 from the part of the bond pad 110 exposed by the opening 116 in the insulating layer 114. The breakdown voltage of the electrically insulative material 122 is greater than the breakdown voltage of the mold compound 126. Accordingly, the electrically insulative material 122 can withstand higher electric field strengths as compared to the mold compound 126. In one embodiment, the breakdown voltage of the electrically insulative material 122 is 400 V/μm or higher. The thickness of the electrically insulative material 122 depends on the application and the expected maximum electric field magnitude. Since the breakdown voltage of the electrically insulative material 122 is greater than the breakdown voltage of the mold compound 126, a more robust breakthrough voltage barrier is provided in the region of the bond pad 110.

In the case of a wire bond as the electrical conductor 118, at least the lower part of the ball end 120 of the wire bond is separated from the mold compound 126 by the electrically insulative material 122. As shown in FIG. 1E, the electrically insulative material 122 may cover the entire ball end 120 of the wire bond such that the entire ball end 120 is separated from the mold compound 126 by the electrically insulative material 122.

The electrically insulative material 122 and/or the insulating layer 114 may have a microroughened surface 128, 130 which increases adhesion by the mold compound 126. The surfaces 128, 130 of the electrically insulative material 122 and the insulating layer 114 may be microroughened by, e.g., galvanic processing.

Figure 2A:
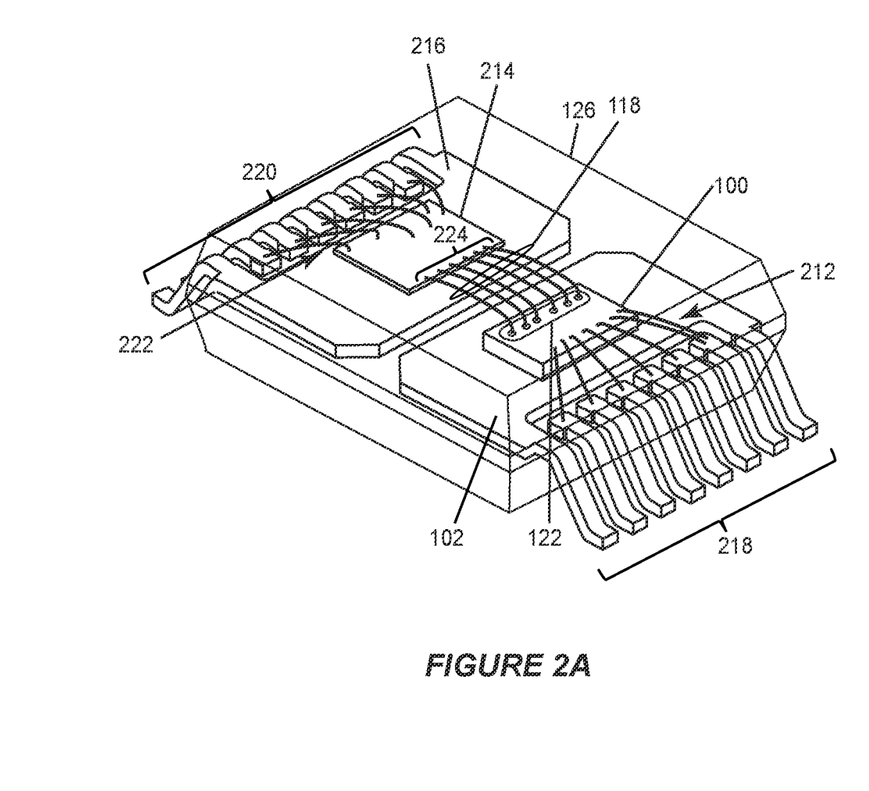
FIGS. 2A through 2O illustrate different views of the molded semiconductor package, according to an embodiment.
Figure 2B:
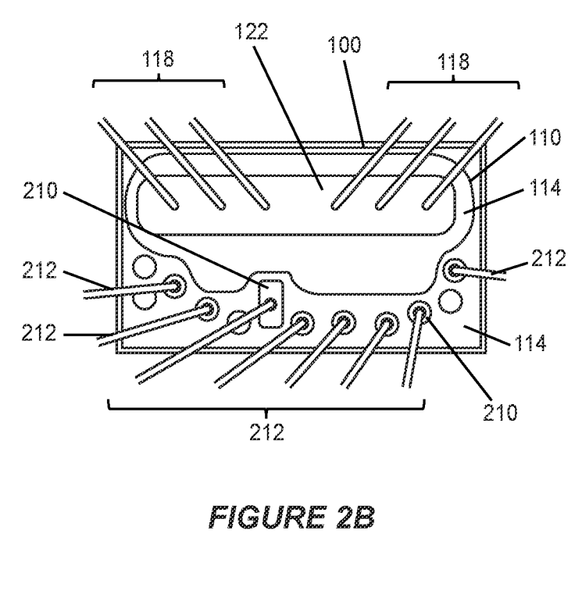
Figure 2C:
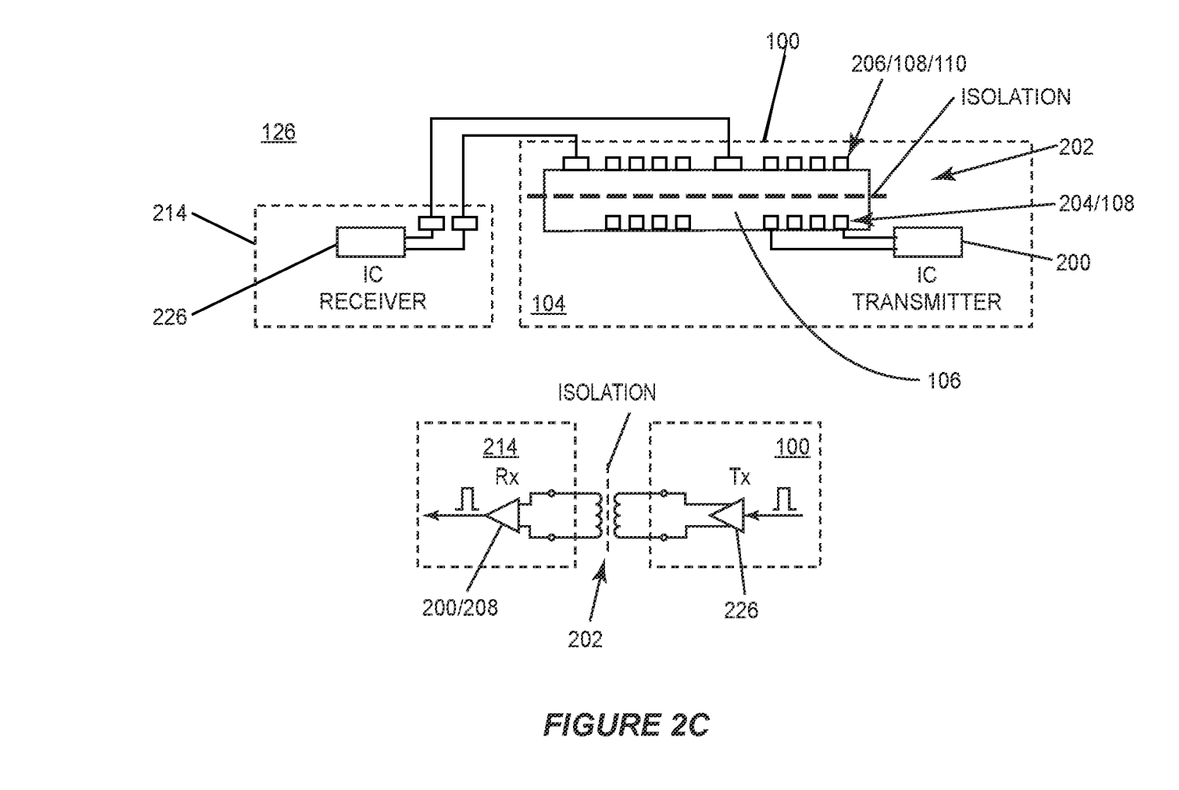

FIGS. 2A through 2C illustrate different views of the molded semiconductor package, according to an embodiment. FIG. 2A shows a side perspective view of the molded semiconductor package, with an outline of the mold compound 126 so that that internal components of the package are visible. FIG. 28 shows a partial top down plan view in a region of the first semiconductor die 100 having a bond pad 110 sealed by the electrically insulative material 122, with the mold compound 126 being omitted so that the electrically insulative material 122 is visible. The upper part of FIG. 2C shows a hybrid side view of the molded semiconductor package and the lower part shows a circuit schematic of an example circuit implemented by the molded semiconductor package.

According to the embodiment illustrated in FIGS. 2A through 20, the first semiconductor die 100 includes receiver ('IC Receiver') circuitry 200 and a coreless transformer 202 that includes a first set of windings 204 galvanically isolated ('Isolation') from a second set of windings 206. The first and second sets of windings 204, 206 may be implemented in different metallization layers 108 of the first semiconductor die 100, and the galvanic isolation between the sets of windings 204, 206 may be provided by one or more of the interlayer dielectrics 106. For example, the last (uppermost) metallization layer 108 may form the upper set of windings 206 whereas a lower metallization layer 108 may form the lower set of windings 206. The last metallization layer 108 includes at least one bond pad 110 sealed by the electrically insulative material 122, which is not shown in FIG. 20 to emphasize other features in this view. Each bond pad 110 connected to the upper set of windings 206 is galvanically isolated from the receiver circuitry 200 such that no direct conduction path is provided between the bond pad(s) 110 and the receiver circuitry 200.

The coreless transformer 202 provides isolation between the primary (high voltage) and secondary (low voltage) sides of the circuit, by electromagnetically coupling each bond pad 110 connected to the upper set of windings 206 to the receiver circuitry 200 of the first semiconductor die 100. The electrically insulative material 122 prevents voltage breakdown between the primary and secondary sides, by providing a higher breakdown voltage capability than the mold compound 126 in the area where the high voltage connection is made to the coreless transformer 202 of the first semiconductor die 100. The coreless transformer 202 may reside on the low voltage side where the chip-to-chip wire connected to receiver side reside in a high voltage area.

The circuitry 200 included in the first semiconductor die 100 may further include high side and low side driver circuitry 208 for a half-bridge, for example. The first semiconductor die 100 may include one or more additional bond pads 210 for accommodating additional electrical connections 212 such as power, ground, etc.

As shown in FIGS. 2A and 20, the molded semiconductor package may further include a second semiconductor die 214 attached to a second substrate 216. In one embodiment, the first and second substrates 102, 216 are die pads of respective lead frames. Each lead frame has leads 218, 220 for providing external electrical connections to the respective dies 100, 214 included in the molded semiconductor package. Connections 212, 222 between the respective dies 100, 214 and the leads 218, 220 of the corresponding lead frames may be made by wire bonds, wire ribbons, metal clips, etc.

The mold compound 126 encases each semiconductor die 100, and the corresponding substrates 102, 216. Each electrical conductor 118 that connects the second semiconductor die 214 to the coreless transformer 202 of the first semiconductor die 100 is attached at a first end to the part of each bond pad 110 of the first semiconductor die 100 exposed by the opening 116 in the insulating layer 114 and at a second end to a corresponding bond pad 224 of the second semiconductor die 214. The electrically insulative material 122 may be selectively applied only at each bond pad opening 116 for the coreless transformer 202 to reduce risk of partial discharge due to high electric fields. More than one additional semiconductor die 214 and corresponding substrate 216 may be provided for driving the coreless transformer 202 of the first semiconductor die 100. In one embodiment, the second semiconductor die 214 includes transmitter ('IC Transmitter') circuitry 226 for transmitting a control signal to the first semiconductor die 100 with very low power dissipation in the transmission section, allowing use of coreless transformer technology in high-frequency switching applications.

Figure 3A:
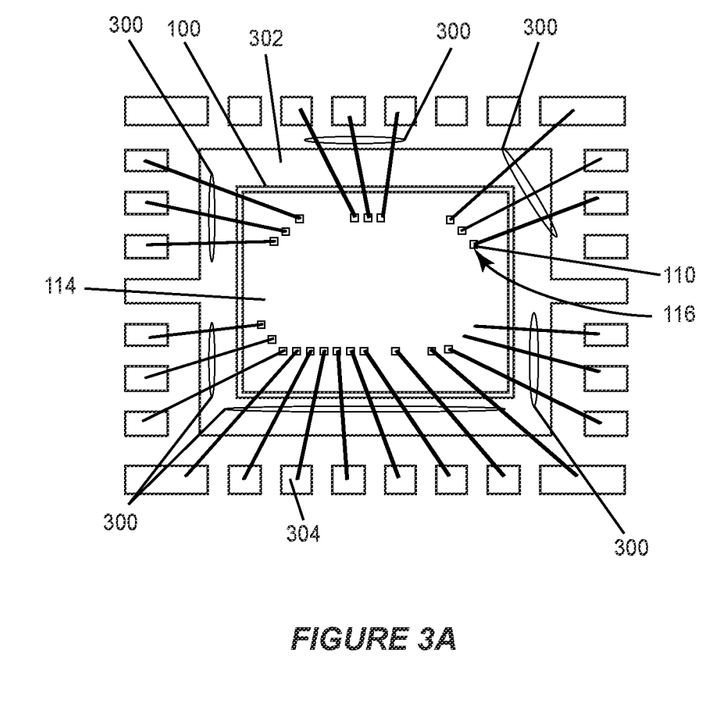
FIGS. 3A and 3B illustrate respective top plan views of the molded semiconductor package during different stages of production, according to another embodiment.
Figure 3B:
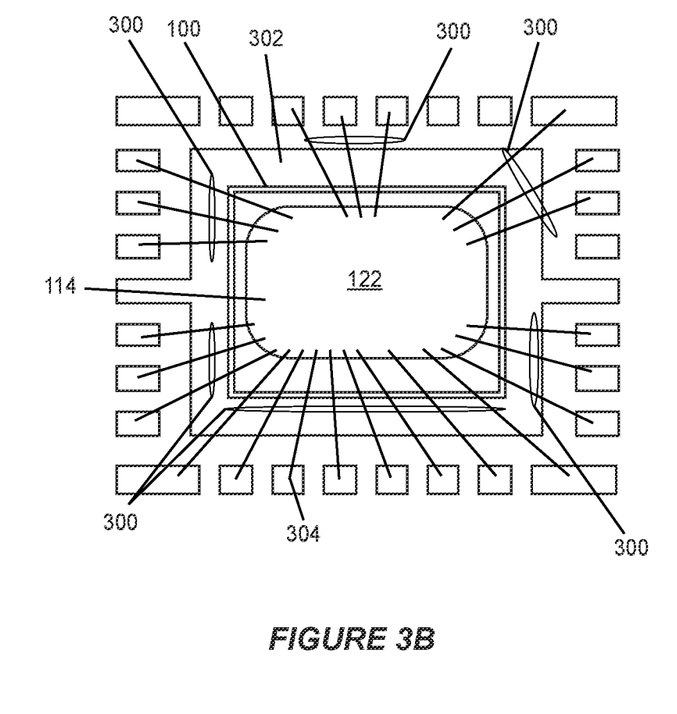

FIGS. 3A and 38 illustrate respective top plan views of the molded semiconductor package during different stages of production, according to another embodiment.

FIG. 3A shows the first semiconductor die 100 after wire bonds 300 are attached to the bond pads 110 of the first semiconductor die 100 and before application of the electrically insulative material 122. According to this embodiment, the substrate 102 is a lead frame that includes a die pad 302 to which the first semiconductor die 100 is attached and leads 304 to which the other end of the wire bonds 300 are attached.

FIG. 3B shows the first semiconductor die 100 after the electrically insulative material 122 fills the openings 116 in the insulating layer 114 and (hermetically) seals the part of each bond pad 110 exposed by the corresponding opening 116 in the insulating layer 114. The electrically insulative material 122 encases at least the part of the end of each wire bond 300 attached to the corresponding bond pad 110, as previously explained herein. According to the embodiment shown in FIGS. 3A and 3B, the electrically insulative material 122 is a single uninterrupted layer deposited over the entire or most (e.g. at least 80%, at least 90%, or more) of the entire top surface of the first semiconductor die 100. The process for dispensing the material used to form the electrically insulative material 122 may be controlled to form a single uninterrupted layer of any desired size, shape, and thickness. In one embodiment, at least all bond pads that require the extra layer of electrically insulative material 122 are covered in a single deposition process which may be by way of dispensing, printing, spin coating, etc.

Figure 4:
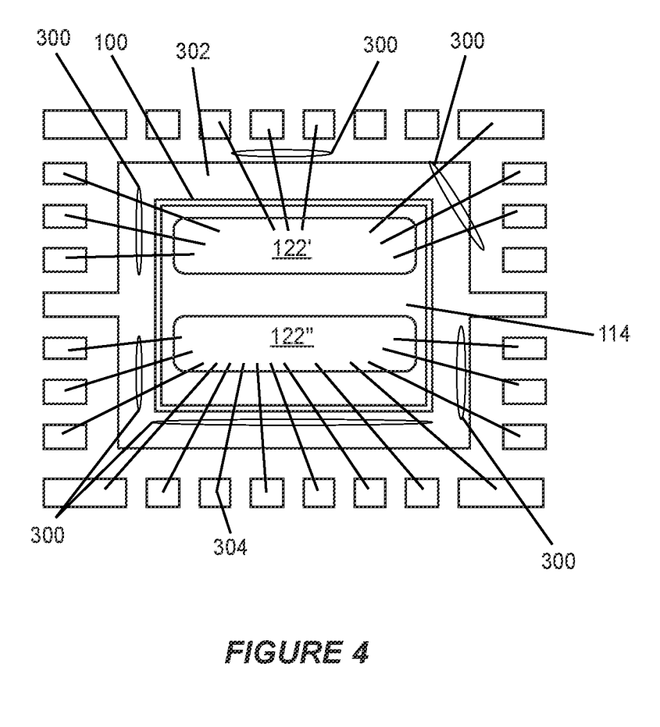
FIG. 4 illustrates a top plan view of the molded semiconductor package prior to molding, according to another embodiment.

FIG. 4 illustrates a top plan view of the molded semiconductor package after dispensing of the electrically insulative material 122 and prior to molding, according to another embodiment. The embodiment shown in FIG. 4 is similar to the embodiment shown in FIG. 3B. Different however, the electrically insulative material 122 is not a single uninterrupted layer but instead includes at least two separate regions 122, 122" sealing different groups of bond pads 110.

The process for dispensing the material used to form each separate region of electrically insulative material 122', 122" may be controlled to form separate regions of any desired size, shape, and thickness.

Figure 5:
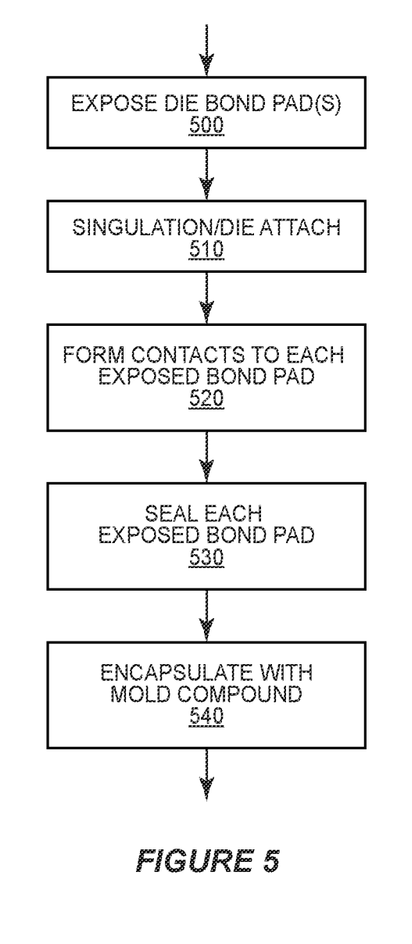
FIG. 5 illustrates a flow diagram of a method of producing the molded semiconductor package.

FIG. 5 illustrates a method of producing the molded semiconductor package described herein. The method includes forming one or more openings 116 in the uppermost insulating layer 114 of the first semiconductor die 110 to expose one or more corresponding bond pads 110 (Block 500). The process for forming the more opening(s) 116 may vary depending on the material composition of the insulating layer 114. For instance, where the insulating layer 114 is an imide layer, the opening(s) 116 may be formed by an imide lithography process comprising one or more lithography steps of coating, exposure and development steps since imide is a photosensitive material. The imide layer with one or more openings 116 formed therein is subsequently subjected to a process for curing the imide. Depending on the composition of the insulating layer 114, other processes such as lithography followed by etching may also be suitable.

The method further includes singulating the corresponding base semiconductor wafer into individual dies and attaching each first semiconductor die 100 to a first substrate 102 (Block 510). Any standard die attach process may be used to attach each first semiconductor die 100 to the corresponding first substrate 102.

The method further includes attaching an electrical conductor 118 to a part of each bond pad 110 exposed by a corresponding opening 116 in the insulating layer 114 (Block 520). This may involve wire bonding, ribbon bonding, attaching a metal clip, etc. Prior to the electrical conductor attachment process, each exposed bond pad 110 may be cleaned, e.g., by a plasma process. In the case of wire bonding, a ball end of a wire bond may be attached to the part of a bond pad 110 exposed by a corresponding opening 116 in the insulating layer 114.

After attaching the electrical conductors 118, the opening(s) 116 in the insulating layer 114 are filled with the electrically insulative material 122 that seals the part of each bond pad 110 exposed by the opening 116 in the insulating layer 114 (Block 530). In one embodiment, a material that comprises a polyimide resin is dispensed into the opening(s) 116 in the insulating layer 114 and the polyimide resin is then cured to form the electrically insulative material 122. As shown in FIG. 3B, the polyimide resin may be dispensed as a single uninterrupted layer over the entire or most (e.g. at least 80%, at least 90%, or more) of the entire top surface of the first semiconductor die. As shown in FIG. 4, the polyimide resin instead may be dispensed as two or more separate layers over different parts of the top surface of the first semiconductor die. In either case, if the insulating layer 114 comprises imide the polyimide resin is cross-linked with the imide after the curing.

After filling the opening(s) 116 in the insulating layer 114 with the electrically insulative material 122, the first semiconductor die 100 is encased in a mold compound 126 (Block 540). Any typical molding process such as injection molding, compression molding, film-assisted molding (FAM), reaction injection molding (RIM), resin transfer molding (RIM), map molding, blow molding, etc. may be used to form the mold compound 126. Common mold compounds and resins include, but are not limited to, thermoset resins, gel elastomers, encapsulants, potting compounds, composites, optical grade materials, etc. The mold compound 126 is separated from the part of each bond pad 110 exposed by the corresponding opening 116 in the insulating layer 114 by the electrically insulative material 122 which has a higher breakdown voltage than the mold compound 126 and therefore provides a more robust breakthrough voltage barrier in the region of the bond pad(s) 110.

Before encasing the first semiconductor die 100 in the mold compound 126, the method may further include applying an adhesion promoter that comprises zinc and chromium to the exposed surface of the electrically insulative material 122 and the insulating layer 114. The exposed surfaces 128, 130 of the electrically insulative material 122 and/or the insulating layer 114 may be microroughened surface, e.g., by galvanic processing to further increase adhesion by the mold compound 126.

After the molding, standard processes such as post-mold curing, de-flashing, electroplating, marking, etc. may be performed.

Although the present disclosure is not so limited, the following numbered examples demonstrate one or more aspects of the disclosure.

Example 1. A molded semiconductor package, comprising: a first semiconductor die attached to a first substrate, the first semiconductor die comprising a first bond pad at a first side of the first semiconductor die which faces away from the first substrate and an insulating layer covering the first side; an electrical conductor attached to a part of the first bond pad exposed by an opening in the insulating layer; a mold compound encasing the first semiconductor die; and an electrically insulative material filling the opening in the insulating layer and sealing the part of the first bond pad exposed by the opening in the insulating layer, wherein the electrically insulative material separates the mold compound from the part of the first bond pad exposed by the opening in the insulating layer, wherein a breakdown voltage of the electrically insulative material is greater than a breakdown voltage of the mold compound.

Example 2. The molded semiconductor package of example 1, wherein the first bond pad is galvanically isolated from circuitry included in the first semiconductor die such that no direct conduction path is provided between the first bond pad and the circuitry.

Example 3. The molded semiconductor package of example 2, wherein the first semiconductor die further comprises a coreless transformer configured to electromagnetically couple the first bond pad to the circuitry.

Example 4. The molded semiconductor package of example 3, wherein the circuitry comprises a high side driver and a low side driver for a half-bridge.

Example 5. The molded semiconductor package of any of examples 1 through 4, wherein the electrically insulative material and the insulating layer are cross-linked to one another along an interface between the electrically insulative material and the insulating layer.

Example 6. The molded semiconductor package of example 5, wherein the electrically insulative material comprises polyimide, wherein the insulating layer comprises imide, and wherein the polyimide is cross-linked with the imide along the interface between the electrically insulative material and the insulating layer.

Example 7. The molded semiconductor package of any of examples 1 through 6, wherein the breakdown voltage of the electrically insulative material is 400 V/μm or higher.

Example 8. The molded semiconductor package of any of examples 1 through 7, wherein the electrical conductor is a wire bond, wherein a ball end of the wire bond is attached to the part of the first bond pad exposed by the opening in the insulating layer, and wherein the electrically insulative material covers a lower part of the ball end disposed closest to the first bond pad such that the lower part of the ball end is separated from the mold compound by the electrically insulative material.

Example 9. The molded semiconductor package of example 8, wherein the electrically insulative material covers the entire ball end of the wire bond such that the entire ball end of the wire bond is separated from the mold compound by the electrically insulative material.

Example 10. The molded semiconductor package of any of examples 1 through 9, wherein the electrically insulative material and the insulating layer each have a microroughened surface which increases adhesion by the mold compound.

Example 11. The molded semiconductor package of any of examples 1 through 10, wherein the entire side of the first semiconductor die which faces away from the first substrate is covered by the electrically insulative material.

Example 12. The molded semiconductor package of any of examples 1 through 11, further comprising a second semiconductor die attached to a second substrate, wherein the mold compound encases the second semiconductor die, and wherein the electrical conductor is attached at a first end to the part of the first bond pad of the first semiconductor die exposed by the opening in the insulating layer and at a second end to a first bond pad of the second semiconductor die.

Example 13. The molded semiconductor package of any of examples 1 through 12, wherein the first semiconductor die comprises a plurality of bond pads at the first side of the first semiconductor die, wherein each bond pad is exposed by an opening in the insulating layer, wherein the electrically insulative material fills each opening in the insulating layer and seals the part of each bond pad exposed by the corresponding opening in the insulating layer, and wherein the electrically insulative material separates the mold compound from the part of each bond pad exposed by the corresponding opening in the insulating layer.

Example 14. The molded semiconductor package of example 13, wherein the electrically insulative material is a single uninterrupted layer.

Example 15. A method of producing a molded semiconductor package, the method comprising: attaching a first semiconductor die to a first substrate, the first semiconductor die comprising a first bond pad at a first side of the first semiconductor die which faces away from the first substrate and an insulating layer covering the first side; forming an opening in the insulating layer which exposes the first bond pad; attaching an electrical conductor attached to a part of the first bond pad exposed by the opening in the insulating layer; after attaching the electrical conductor, filling the opening in the insulating layer with an electrically insulative material that seals the part of the first bond pad exposed by the opening in the insulating layer; and after filling the opening in the insulating layer with the electrically insulative material, encasing the first semiconductor die in a mold compound, wherein the mold compound is separated from the part of the first bond pad exposed by the opening in the insulating layer by the electrically insulative material, wherein a breakdown voltage of the electrically insulative material is greater than a breakdown voltage of the mold compound.

Example 16. The method of example 15, wherein filling the opening in the insulating layer with the electrically insulative material comprises: dispensing a material that comprises a polyimide resin into the opening in the insulating layer; and curing the polyimide resin.

Example 17. The method of example 16, wherein the insulating layer comprises imide, and wherein the polyimide resin is cross-linked with the imide after the curing.

Example 18. The method of any of examples 15 through 17, wherein attaching the electrical conductor comprises: attaching a ball end of a wire bond to the part of the first bond pad exposed by the opening in the insulating layer, wherein after filling the opening in the insulating layer with the electrically insulative material, the electrically insulative material covers a lower part of the ball end disposed closest to the first bond pad such that the lower part of the ball end is separated from the mold compound by the electrically insulative material.

Example 19. The method of example 18, wherein after filling the opening in the insulating layer with the electrically insulative material, the electrically insulative material covers the entire ball end of the wire bond such that the entire ball end of the wire bond is separated from the mold compound by the electrically insulative material.

Example 20. The method of any of examples 15 through 19, wherein filling the opening in the insulating layer with the electrically insulative material comprises: covering the entire side of the first semiconductor die which faces away from the first substrate with the electrically insulative material.

Example 21. The method of example 20, further comprising: before encasing the first semiconductor die in the mold compound, applying an adhesion promoter that comprises zinc and chromium to an exposed surface of the electrically insulative material and the insulating layer.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A molded semiconductor package, comprising:
    a first semiconductor die attached to a first substrate, the first semiconductor die comprising a first bond pad at a first side of the first semiconductor die which faces away from the first substrate and an insulating layer covering the first side;
    an electrical conductor attached to a part of the first bond pad exposed by an opening in the insulating layer;
    a mold compound encasing the first semiconductor die; and an electrically insulative material filling the opening in the insulating layer and sealing the part of the first bond pad exposed by the opening in the insulating layer,
wherein the electrically insulative material separates the mold compound from the part of the first bond pad exposed by the opening in the insulating layer.

2. The molded semiconductor package of claim 1, wherein the first bond pad is galvanically isolated from circuitry included in the first semiconductor die such that no direct conduction path is provided between the first bond pad and the circuitry.

3. The molded semiconductor package of claim 2, wherein the first semiconductor die further comprises a coreless transformer configured to electromagnetically couple the first bond pad to the circuitry.

4. The molded semiconductor package of claim 3, wherein the circuitry comprises a high side driver and a low side driver for a half-bridge.

5. The molded semiconductor package of claim 1, wherein the electrically insulative material and the insulating layer are cross-linked to one another along an interface between the electrically insulative material and the insulating layer.

6. The molded semiconductor package of claim 5, wherein the electrically insulative material comprises polyimide, wherein the insulating layer comprises imide, and wherein the polyimide is cross-linked with the imide along the interface between the electrically insulative material and the insulating layer.

7. The molded semiconductor package of claim 1, wherein a breakdown voltage of the electrically insulative material is 400 V/µm or higher.

8. The molded semiconductor package of claim 1, wherein the electrical conductor is a wire bond, wherein a ball end of the wire bond is attached to the part of the first bond pad exposed by the opening in the insulating layer, and wherein the electrically insulative material covers a lower part of the ball end disposed closest to the first bond pad such that the lower part of the ball end is separated from the mold compound by the electrically insulative material.

9. The molded semiconductor package of claim 8, wherein the electrically insulative material covers the entire ball end of the wire bond such that the entire ball end of the wire bond is separated from the mold compound by the electrically insulative material.

10. The molded semiconductor package of claim 1, wherein the electrically insulative material and the insulating layer each have a microroughened surface which increases adhesion by the mold compound.

11. The molded semiconductor package of claim 1, wherein the entire side of the first semiconductor die which faces away from the first substrate is covered by the electrically insulative material.

12. The molded semiconductor package of claim 1, further comprising a second semiconductor die attached to a second substrate, wherein the mold compound encases the second semiconductor die, and wherein the electrical conductor is attached at a first end to the part of the first bond pad of the first semiconductor die exposed by the opening in the insulating layer and at a second end to a first bond pad of the second semiconductor die.

13. The molded semiconductor package of claim 1, wherein the first semiconductor die comprises a plurality of bond pads at the first side of the first semiconductor die, wherein each bond pad is exposed by an opening in the insulating layer, wherein the electrically insulative material fills each opening in the insulating layer and seals the part of each bond pad exposed by the corresponding opening in the insulating layer, and wherein the electrically insulative material separates the mold compound from the part of each bond pad exposed by the corresponding opening in the insulating layer.

14. The molded semiconductor package of claim 13, wherein the electrically insulative material is a single uninterrupted layer.

15. A method of producing a molded semiconductor package, the method comprising:
attaching a first semiconductor die to a first substrate, the first semiconductor die comprising a first bond pad at a first side of the first semiconductor die which faces away from the first substrate and an insulating layer covering the first side;
attaching an electrical conductor to a part of the first bond pad exposed by an opening in the insulating layer;
encasing the first semiconductor die in a mold compound; and
filling the opening in the insulating layer and sealing the part of the first bond pad exposed by the opening in the insulating layer with an electrically insulative material,
wherein the electrically insulative material separates the mold compound from the part of the first bond pad exposed by the opening in the insulating layer.

16. The method of claim 15, wherein filling the opening in the insulating layer with the electrically insulative material comprises:
dispensing a material that comprises a polyimide resin into the opening in the insulating layer; and
curing the polyimide resin.

17. The method of claim 16, wherein the insulating layer comprises imide, and wherein the polyimide resin is cross-linked with the imide after the curing.

18. The method of claim 15, wherein attaching the electrical conductor comprises:
attaching a ball end of a wire bond to the part of the first bond pad exposed by the opening in the insulating layer,
wherein after filling the opening in the insulating layer with the electrically insulative material, the electrically insulative material covers a lower part of the ball end disposed closest to the first bond pad such that the lower part of the ball end is separated from the mold compound by the electrically insulative material.

19. The method of claim 18, wherein after filling the opening in the insulating layer with the electrically insulative material, the electrically insulative material covers the entire ball end of the wire bond such that the entire ball end of the wire bond is separated from the mold compound by the electrically insulative material.

20. The method of claim 15, wherein filling the opening in the insulating layer with the electrically insulative material comprises:
covering the entire side of the first semiconductor die which faces away from the first substrate with the electrically insulative material.

21. The method of claim 20, further comprising:
before encasing the first semiconductor die in the mold compound, applying an adhesion promoter that comprises zinc and chromium to an exposed surface of the electrically insulative material and the insulating layer.

* * * * *